(12) United States Patent
Mamine et al.

(10) Patent No.: US 6,549,608 B1
(45) Date of Patent: Apr. 15, 2003

(54) SEMICONDUCTOR MANUFACTURING APPARATUS AND SEMICONDUCTOR DEVICE MANUFACTURING METHOD

(75) Inventors: Takayoshi Mamine, Kanagawa (JP);
Nobuyuki Matsuzawa, Kanagawa (JP);
Noriyuki Kishii, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/538,737

(22) Filed: Mar. 30, 2000

(30) Foreign Application Priority Data

Jan. 4, 1999 (JP) .......................................... 11-094973

(51) Int. Cl.[7] ................................................ G21K 5/00
(52) U.S. Cl. ............................ 378/34; 250/427; 378/35
(58) Field of Search ............................ 378/34, 35, 119, 378/121; 372/5; 204/192.1; 438/798, 795, 949, 707; 250/427, 492.2, 398

(56) References Cited

U.S. PATENT DOCUMENTS 5,227,733 A * 7/1993 Yamada ...................... 328/234
5,268,951 A * 12/1993 Flamholz et al. ............. 378/34
5,825,847 A * 10/1998 Ruth et al. .................. 378/119

* cited by examiner

*Primary Examiner*—Caridad Everhart
(74) *Attorney, Agent, or Firm*—Rader, Fishman & Grauer PLLC; Ronald P. Kananen, Esq.

(57) ABSTRACT

To provide a semiconductor manufacturing apparatus and a semiconductor device manufacturing method able to form a sufficiently precise pattern by ablation.

A semiconductor manufacturing apparatus comprising a light source emitting light of a first wavelength on the surface of a wafer and a mask through which at least a part of the light of the first wavelength passes and removing a material of the part of the wafer exposed by the light of the first wavelength by vaporization, wherein the light source comprises an electron beam generating means for generating an electron beam and a light emitting means for emitting light of a second wavelength longer than the first wavelength and wherein the light of the first wavelength is inverse Compton scattered light obtained by collision of electrons in the electron beam with photons in the light of the second wavelength causing the energy of the electrons to be given to the photons and a semiconductor device manufacturing method using the apparatus.

7 Claims, 3 Drawing Sheets

SEMICONDUCTOR MANUFACTURING APPARATUS AND SEMICONDUCTOR DEVICE MANUFACTURING METHOD

BACKGROUND OF THE INVENTION

1. Field of the Invention

The present invention relates to a semiconductor manufacturing apparatus and a semiconductor device manufacturing method, more particularly a semiconductor manufacturing apparatus emitting light having a high brightness, high energy, and short pulse width for ablation to form a pattern on a wafer and a semiconductor device manufacturing method using the apparatus.

2. Description of the Related Art

In a conventional process of production of a semiconductor device, when patterning a wafer or a coating film formed on it, it is usually etched using a resist as a mask. For the above etching, first, the resist is coated on the surface of the material to be etched. Next, this is exposed using a photolithographic mask to transfer the pattern formed by the photolithographic mask on the surface of the resist (photolithography process). Next, an unnecessary part of the resist is removed by using a developing fluid. By the development, an exposed or unexposed part of the resist is removed. After this, the material to be etched is etched using the patterned resist as a mask.

Since formation of a pattern by etching requires the above series of steps, there is a disadvantage of the required time becoming long. Also, development of the resist or etching of various materials requires different and expensive apparatuses. Further, in the case of dry etching, a large amount of etching gas is necessary. This has become one of the reasons for raising the production costs of semiconductor devices. There is also a problem in that the environmental load of the etching gas used for the etching is large.

Unlike the above etching, the method is also known emitting light using a high-brightness light source and sublimating the material to form a pattern (ablation). In ablation, the inner-shell electrons of various materials participate in a photochemical reaction to form a pattern to a high precision.

As materials for which it is confirmed a pattern can be formed by ablation, specifically the organic material polymethyl methacrylate (R. Srinivasan and Bodil Braren, *Applied Physics Letters*, 1988, 53, 1233) and Teflon (S. Kuper and M. Stuke, *Applied Physics Letters*, 1989, 54, 4), the inorganic material $SiO_2$, and the semiconductor material GaAs can be mentioned.

Also, there is an example of not forming a resist on the wafer but directly emitting laser light passing through a mask on the surface of the wafer to form a pattern by ablation (Sugioka, Koji, Tashiro, Hideo, and Wada, Tomoyuki, *OPTRONICS*, 1998, 98).

Further, a processing device using ablation to be able to form a pattern on, for example, a polyimide film is disclosed by Japanese Unexamined Patent Publication (Kokai) No. 8-155667. This processing device emits a laser beam having a pulse width of about 20 ns, for example, to process a material.

Alternatively, a method and apparatus using ablation to form a signal groove (pit) on an optical disk comprised of a synthetic resin are disclosed in Japanese Unexamined Patent Publication (Kokai) No. 8-124226. According to this method of production of an optical disk, it is possible to use a fourth harmonic (266 nm wavelength) of for, example, an Nd:YAG laser to form a pit (currently 0.4 µm in width).

In addition to the above, a method of production of a liquid-crystal display element using ablation to form a pattern on thin film layers of liquid-crystal display elements is disclosed in Japanese Unexamined Patent Publication (Kokai) No. 8-6070. In this method of production, a pattern is formed by using an excimer laser of an ultraviolet region such as a KrF laser (248 nm wavelength), a XeCl excimer laser (308 nm wavelength), or an ArF excimer laser (193 nm wavelength). Also, the pulse width of these lasers is about 10 to 100 ns.

However, according to the above conventional examples of forming patterns by ablation, although high precision processing is possible compared with etching, it has been difficult to form a pattern sufficiently fine to meet with the increasing miniaturization of semiconductor devices. In the conventional ablation method, a pattern is formed by using a nanosecond pulse. Therefore, the density of photons per unit time becomes lower than even that in the case of using an ultra-short time pulse shorter than that such as a picosecond or femtosecond order pulse.

When performing ablation under conditions of low photon density, it is necessary to make the molecules of the material change to a first excited state, then change to a second and higher excited states by simultaneously emitting light of two different wavelengths. Therefore, there is the restriction that it is necessary to make the imaging positions of the high-brightness light sources of the two wavelengths match and secure the paths for the lights of the two wavelengths and the hardware becomes complicated.

There are many unclear points regarding the mechanism by which ablation occurs. In the actual process of production of semiconductors, the parameters for controlling the ablation process, the suitable system configurations, etc. have not yet been established.

SUMMARY OF THE INVENTION

An object of the present invention is to provide a semiconductor manufacturing apparatus and a method of producing a semiconductor device able to form a sufficiently precise pattern by ablation.

To achieve the above object, the semiconductor manufacturing apparatus of the present invention is a semiconductor manufacturing apparatus comprising a light source for emitting light of a first wavelength on a surface of a wafer and a mask through which at least part of the light of the first wavelength passes and removing a material of the part of the wafer exposed by the light of the first wavelength by vaporization, characterized in that the light source comprises an electron beam generating means for generating an electron beam and a light emitting means for emitting light of a second wavelength longer than the first wavelength and in that the light of the first wavelength is an inverse Compton scattered light obtained by collision of electrons in the electron beam with photons in the light of the second wavelength causing the energy of the electrons to be given to the photons.

The semiconductor manufacturing apparatus of the present invention preferably is characterized in that the light emitting means comprises a laser. The semiconductor manufacturing apparatus of the present invention more preferably is characterized in that the laser comprises a pulsed laser.

The semiconductor manufacturing apparatus of the present invention preferably is characterized in that the light source has at least a pair of reflecting means for reflecting the light of the second wavelength back and forth.

Also, to achieve the above object, the semiconductor manufacturing apparatus of the present invention is a semiconductor manufacturing apparatus comprising a light source for emitting a pulsed light to a surface of a wafer and a mask through which at least a part of the pulsed light passes and removing a material of the part of the wafer exposed by the pulsed light by vaporization, characterized in that the pulsed light emitted from the light source has a wavelength of not more than about 300 nm and a pulse width of not more than about 1 ns.

The semiconductor manufacturing apparatus of the present invention preferably is characterized in that the light source comprises a light source emitting a synchrotron radiation light. Alternatively, the semiconductor manufacturing apparatus of the present invention preferably is characterized in that the light source emits a laser plasma light.

Due to this, it is made possible to make inner-shell electrons of a material at the surface of a wafer dissociate and make the material of the light exposed part subliminate. According to the semiconductor manufacturing apparatus of the present invention, since a light source for emitting light of a high brightness, high energy, and short pulse width is used, it is possible to form a distinct fine pattern on the surface of a wafer.

Further, to achieve the above object, the semiconductor device manufacturing method of the present invention is characterized by comprising the steps of generating light of a first wavelength; emitting the light of the first wavelength to the surface of a wafer via a mask through which at least part of the light of the first wavelength passes; and removing material of a part of a wafer exposed by the light of the first wavelength by vaporization, wherein the step of generating the light of the first wavelength comprises the steps of generating an electron beam from an electron beam generating mean; generating light of a second wavelength longer than the first wavelength; and making electrons in the electron beam collide with photons in the light of the second wavelength to generate inverse Compton scattered light with the energy of the electrons given to the photons.

The semiconductor device manufacturing method of the present invention preferably is characterized in that the light of the second wavelength comprises a laser light. The semiconductor device manufacturing method of the present invention more preferably is characterized in that the laser light comprises a pulsed light.

The semiconductor device manufacturing method of the present invention preferably is characterized in that the step of generating the light of the first wavelength comprises a step of using at least a pair of reflecting means to reflect the light of the second wavelength back and forth to make the electrons collide with the photons.

The semiconductor device manufacturing method of the present invention preferably is characterized in that a dielectric layer is formed on the surface of the wafer. Alternatively, the semiconductor device manufacturing method of the present invention preferably is characterized in that a semiconductor layer is formed on the surface of the wafer. Alternatively, the semiconductor device manufacturing method of the present invention preferably is characterized in that a metal layer is formed on the surface of the wafer.

To achieve the above object, the semiconductor device manufacturing method of the present invention is characterized by comprising the steps of emitting a pulsed light of predetermined wavelength to a surface of a wafer via a mask through which at least a part of the pulsed light passes and removing a material of the part of the wafer exposed by the pulsed light by vaporization, wherein the pulsed light has a wavelength of not more than about 300 nm and a pulse width of not more than about 1 ns.

The semiconductor device manufacturing method of the present invention preferably is characterized in that the pulsed light is a synchrotron radiation light. Alternatively, the semiconductor device manufacturing method of the present invention preferably is characterized in that the pulsed light comprises a laser plasma light.

Due to this, it is made possible to perform ablation of a material at the surface of a wafer and to form a fine pattern distinctly. According to the semiconductor device manufacturing method of the present invention, unlike the case of conventional etching, a series of steps such as exposure and development of a resist and etching using the resist as a mask becomes unnecessary. By emitting a light of high brightness, high energy, and short pulse width on the surface of a wafer via a mask, the material of the light-exposed part can be removed, so it is made possible to simplify the process of production.

Also, in the semiconductor device manufacturing method of the present invention, when forming a resist on the surface of the wafer and emitting light there, it is also possible to continuously pattern the resist and pattern a base wafer material.

BRIEF DESCRIPTION OF THE DRAWINGS

These and other objects and features of the present invention will become clearer from the following description of the preferred embodiments given with reference to the accompanying drawings, in which:

FIG. 4A is a view of the configuration of a light source part of a semiconductor manufacturing apparatus of the present invention according to Example 1 and Example 2, while

DESCRIPTION OF THE PREFERRED EMBODIMENTS

Figure 1:
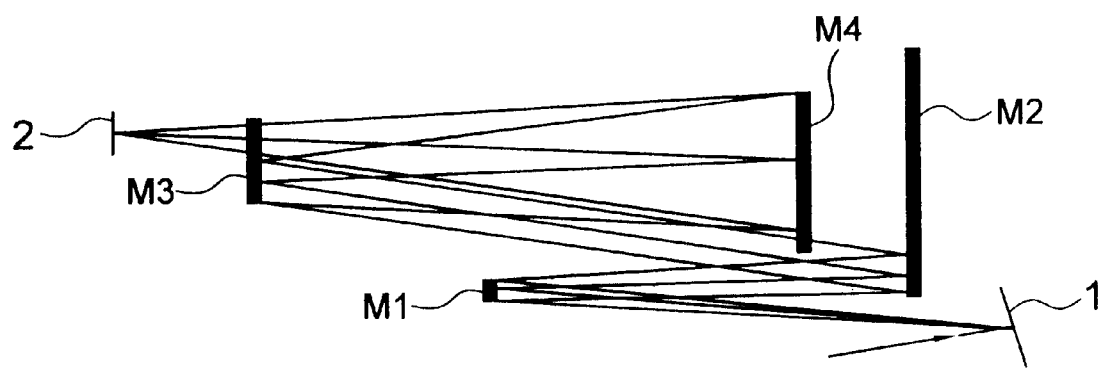
FIG. 1 is a schematic view of an example of a reduction X-ray exposure system usable for a semiconductor manufacturing apparatus of the present invention.

Below, preferred embodiments will be described with reference to the accompanying drawings.

In the semiconductor manufacturing apparatus of the present invention, a vaporization reaction of a material by light irradiation (ablation) is used to remove the material of an exposed part and form a pattern on the surface. As factors affecting the ablation, generally the energy of photons (wavelength) and the number of photons can be mentioned.

The former photon energy is important for exciting the inner-shell electrons. A shorter wavelength is preferable. Specifically, in the case that a material of the surface to be processed is an organic material such as an acrylic resin or a fluororesin or an inorganic material such as $SiO_2$, an ultraviolet light and a vacuum ultraviolet (VUV) of a wavelength shorter than about 300 nm and, in addition, a light of high energy within the range of soft X-rays to X-rays to γ-rays is preferable.

The energy of the light emitted from the high-brightness light source to the material of the surface to be processed is proportional to the frequency of the light. Therefore, even if the number of photons to be irradiated is small, if the photon energy is high, in other words, the wavelength of light is short, ablation is promoted.

As to the latter number of photons, it is considered that increasing the number of photons is important for promoting the process of absorption of multiple photons. In the case of an ultraviolet light and vacuum ultraviolet light of a wavelength not more than 300 nm, a pulse intensity of more than 0.01 J/cm$^2$, more preferably, more than 0.1 J/cm$^2$ is preferable. In the case of light within the range of soft X-rays to X-rays to γ-rays, whether there is a limited threshold in the pulse intensity has not been clarified.

Also, as a third factor affecting ablation, a pulse width of a photon flux can be mentioned. The number of photons N' corresponding to the peak power of the light emitted from the light source is expressed by the number of photons N and the pulse width t by:

$$N'=N/t$$

In an X-ray emitted by laser Compton scattering (LCS, described later in details), if taking the number of photons readily obtainable in practice (N≈10$^4$) as an example and assuming t≈100 fs (femtoseconds), a photon flux expressed by:

$$N'=10^4/10^{-13}=10^{17} \text{ (photons/second)}$$

can be obtained.

By generating a photon flux with a short pulse width, it is possible to increase the photon density and to promote the process of absorption of multiple photons.

When the material of the surface to be processed is an organic material such as an acrylic resin or a fluororesin or an inorganic material such as SiO$_2$ and ablation is performed using an ultraviolet light and a vacuum ultraviolet light of a shorter wavelength than 300 nm, it is preferable that the pulse width be 1 ns. In the case of light within the range of soft X-rays to X-rays to γ-rays, though the threshold level for the pulse width has not been clarified, generally ablation is promoted the shorter the pulse width.

Assuming the above general characteristics of ablation, embodiments of the semiconductor manufacturing apparatus and the semiconductor device manufacturing method of the present invention will be explained below with reference to the drawings.

The semiconductor manufacturing apparatus of the present invention is basically configured by (1) a light source, (2) an optical system for focusing light, (3) a mask, and (4) an optical system for illumination and forms a pattern on the surface to be processed or a wafer.

As the light source (1), a light source satisfying all or any of the conditions of high brightness, high energy (short wavelength), and short pulse is used. Specifically, an ultraviolet light or a vacuum ultraviolet light of a wavelength not more than 300 nm or light within the range of soft X-rays to X-rays to γ-rays is used. In the case of an ultraviolet light or vacuum ultraviolet light, it is preferable that a pulse width be not more than 1 ns.

The optical system for focusing light (2) is an optical system focusing the high energy photons emitted from the light source and for example uses an electron lens.

The mask (3) is a mask formed with a pattern to be transferred to the surface to be processed or wafer and is arranged between the light source (1) and the surface to be processed (or the surface of the wafer).

The optical system for illumination (4) is an optical system for making a photon flux passing through the mask (3) or a photon flux reflected at the mask (3) refract or reflect to reach the surface to be processed or the wafer.

Using the semiconductor manufacturing apparatus of the present invention having such a configuration to emit high energy photons on a wafer formed on its surface with a resist or other blocking material, it becomes possible to form a pattern.

FIG. 1 shows an example of a 4:1 reduction X-ray exposure system able to meet the needs of the 0.10 µm generation. In the system of FIG. 1, light from a light source is reflected at a mask 1 (or, while not shown, passing also possible), then is reflected at four mirrors (M1 to M4) and reaches a wafer 2.

In the conventional photolithography process, a pattern on a mask is transferred on a resist by exposure, then the wafer is conveyed out from the exposure system and the resist developed. Next, the resist selectively left on the wafer is used as a mask and for example a SiO$_2$ layer or a metal interconnecting material etc. etched.

On the other hand, in the system configuration of the present invention shown in FIG. 1, it is possible to continuously pattern parts of organic materials, inorganic materials, metals, and other various materials or combinations of the same by ablation.

In the past, there had been insufficient study made of the light sources for processing wafers by ablation or the conditions for light emission. This has obstructed practical application of ablation in the production of semiconductor devices.

Below, light sources able to be used for the apparatus of the present invention and conditions of emitting them will be explained.

(A) Synchrotron Radiation Light

A synchrotron radiation light can be considered a white light source having a sufficiently high brightness. By introducing a wiggler in a synchrotron radiation generating system to bend a circular orbit of electrons drastically, the synchrotron radiation light can be shortened in wavelength to up to 100 keV (about 0.1 Å). Alternatively, it is possible to obtain a highly monochromatic light of a high intensity (coherent light) by introducing an undulator.

Also, synchrotron radiation light is basically a continuous wave (CW) light source. As parameters enabling change of the ablation conditions, increasing the brightness by storing a large electric current or selecting the wavelength by passing the light through a band-pass filter can be mentioned.

(B) Laser Plasma Light

Laser plasma light is generated by emission of a laser light for excitation on to a target. Laser plasma light can be increased in brightness by raising an output power of the excitation laser. Also, the pulse width of the laser plasma light depends on the pulse width of the excitation laser, and thus it is possible to shorten the pulse to a sub-picosecond order (about 100 fs).

In the laser plasma light, the wavelength generating high energy photons is determined by the characteristic X-rays of a target material. Therefore, the target must be changed for obtaining light of a different wavelength. A target material generating high energy photons of a wavelength not more than 1 Å has not been obtained yet.

Based on the above, as the parameters for optimizing the ablation conditions, the output power of an excitation laser and the pulse width of an excitation laser can be mentioned.

(C) Laser Compton Scattering (LCS) Light

It is also possible to make the electron beam and laser beam collide and use the inverse Compton scattering effect to generate a short wavelength light for use as a light source of the semiconductor manufacturing apparatus of the present invention. Light sources of short wavelength light using the inverse Compton scattering effect have been already reported (Japanese Patent Application No. 10-73649 or Japanese Patent Application No. 9-63294).

Figure 2:
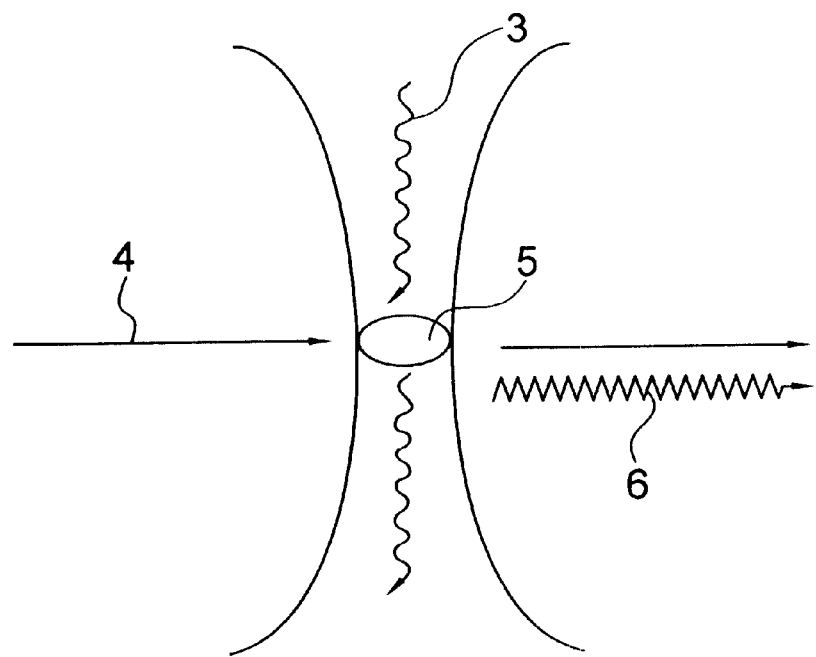
FIG. 2 is a schematic view of a light source part of a semiconductor manufacturing apparatus of the present invention.

FIG. 2 is a schematic view of laser Compton scattering. As shown in FIG. 2, the above-mentioned light source of short wavelength light comprises a reflecting means comprised of at least one pair of concave mirrors, a light emitting means for emitting light to the reflecting mean, and an electron beam generating means for emitting an electron beam 4 toward a light (preferably laser light) 3 emitted from the light emitting means and converged and repeatedly reflected at the reflecting mean. Due to the incidence of the electron beam 4, the light 3 and the electron beam 4 collide at a high density in a scattering region 5 and a scattered light (X-rays, for example) 6 can be obtained.

As the light emitting mean, in addition to various kinds of CW-mode lasers, Q-switched lasers enabling pulsed oscillation can be used. Specifically, an Nd:YAG laser, a titanium-sapphire laser, and various kinds of excimer lasers such as a XeCl excimer laser, a KrF excimer laser, an ArF excimer laser, etc. or an X-ray laser can be mentioned.

As the electron beam generating means, an apparatus able to generate an electron beam with an acceleration voltage of 100 keV or more and a velocity of about 0.5×c (where c represents the velocity of light) or more, such as an electron gun or an electron beam linear accelerator (Linac), can be used.

As the electron beam linear accelerator, a traveling wave linear accelerator, a standing wave linear accelerator, an induction linear accelerator, a high voltage rectification accelerator (a Cockcroft-Walton accelerator, for example), a Van de Graff accelerator, a resonance transformer accelerator, etc. can be used. As the traveling wave linear accelerator, an Alvarez type, coupling cavity type, and high frequency quadrapole type, can be mentioned. Also, the electron beam linear accelerator may be provided with a device for bunching electrons called a "buncher".

By using a light source using the inverse Compton scattering effect, it is possible to control the wavelength of high energy photons to any wavelength in the range of soft X-rays to X-rays to γ-rays by changing the energy of the electron beam. Further, in laser Compton scattering, it is also possible to control the pulse width of the generated high energy photons to any width by adjusting an angle of collision of the electron beam and the laser beam.

The laser light is focused at the substantial center of the pair of concave mirrors and is reflected repeatedly between the concave mirrors. It is preferable that the pulse width of the laser beam be made to correspond to a beam diameter of the electron beam in order to make the electron beam and the laser beam collide precisely at the focus point.

For example, in the case of focusing an electron beam to a 30 μm diameter, the time required for the laser beam to pass through the electron beam becomes 30 (μm)/3×10$^{10}$ (cm/s)=100 (fs). Therefore, in this case, by setting the pulse width of the laser light to 100 femtoseconds, it becomes possible to make the electron beam and laser beam collide at a high efficiency and obtain a high yield of scattered light.

In the case of using laser Compton scattered light as a light source of the semiconductor manufacturing apparatus of the present invention, as a parameter for optimizing the ablation condition, first the acceleration energy of an electron beam can be mentioned. It is possible to control the wavelength of high energy photons by controlling the acceleration energy of the electron beam colliding with the laser beam.

As another parameter, the angle of collision of the electron beam and the laser beam can be mentioned. It is possible to control the pulse width of the generated photon flux by controlling the collision angle.

Further, the output of the laser light is also a parameter. It becomes possible to raise the brightness of high energy photons by increasing the output of the laser light.

The light source used for the semiconductor manufacturing apparatus of the present invention may be variable in wavelength or variable in pulse width.

The yield γ of scattered light in the inverse Compton scattering effect is represented as:

$$\gamma N_e N_p S/A$$

($N_e$: number of electrons, $N_p$: number of photons, s: electron-photon scattering cross-section, A: cross-section of a region where two beams collide (scattering region)).

In inverse Compton scattering, since the total scattering cross-section s of the electrons and photons is a small one of about 10$^{-24}$ cm$^2$, the yield γ of photons is relatively low. To increase the yield γ, the methods of raising an output of laser power, developing a large current electron beam source, reducing the focusing diameter of the electron beam and laser beam, etc. can be considered, there are limits by just improvement of these individual elements.

Figure 3:
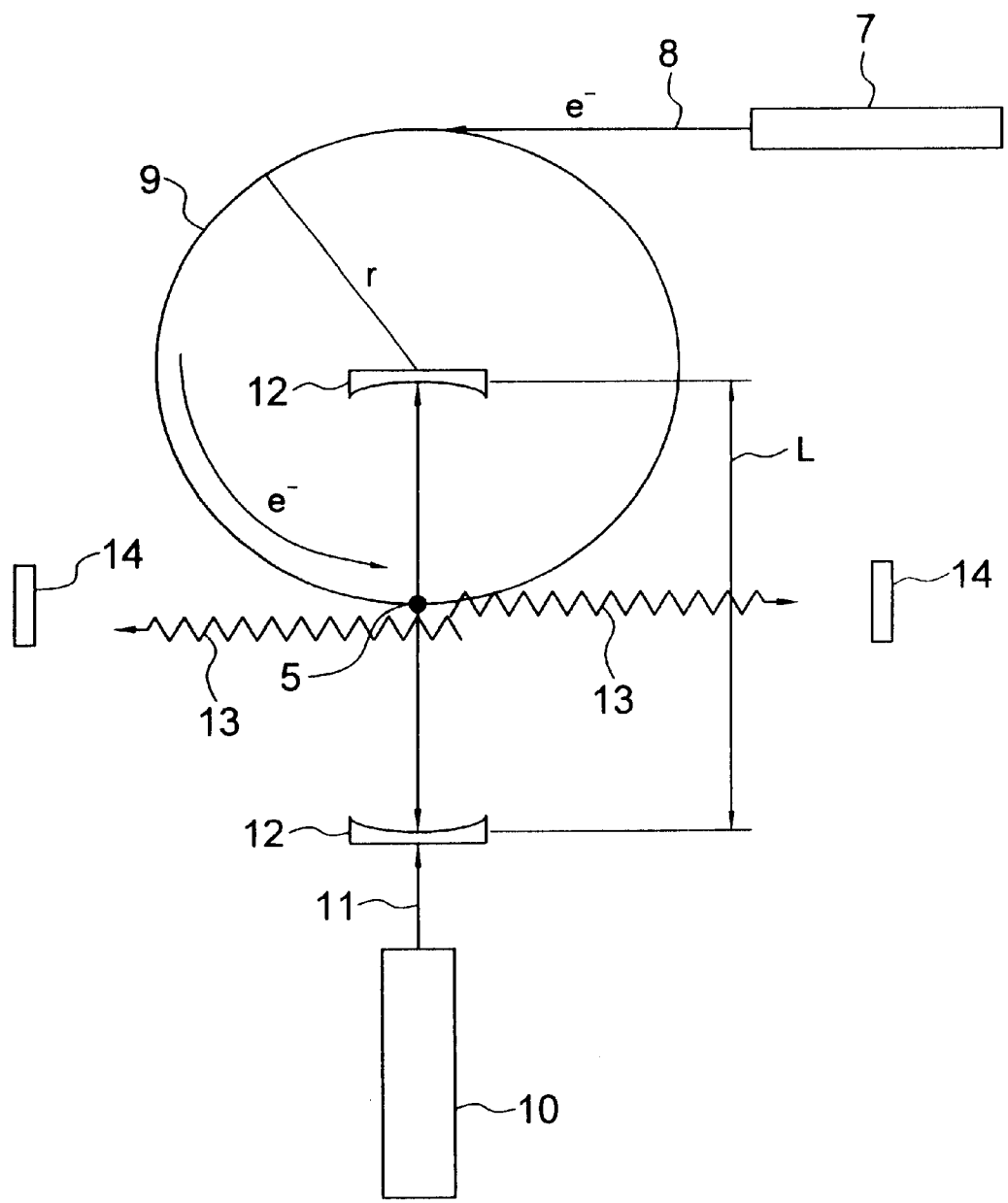
FIG. 3 is a schematic view of a light source part of a semiconductor manufacturing apparatus of the present invention.

Generally, while the number of photons from an 1J class high output laser is about 10$^{19}$, the number of electrons in the electron beam is not more than 10$^{12}$. For increasing the number of electrons $N_e$ or the number of photons $N_p$ as an extension of the current system, the apparatus of the present embodiment stores an electron beam for a certain time in the scattering region where the electron beam and the laser beam collide. FIG. 3 is a schematic view of a light source part of the semiconductor manufacturing apparatus of the present invention. According to the apparatus shown in FIG. 3, it is possible to store electrons for a certain time and increase the yield γ of scattered light.

In the apparatus shown in FIG. 3, the electron beam 8 emitted from the electron beam source 7 is stored at an electron storage ring 9. On the other hand, laser light 11 emitted from a laser 10 is reflected at a mirror 12 and travels back and forth between the mirrors 12. The distance between the mirrors 12 becomes resonator length L of laser Compton scattered light. In the electron storage ring 9, the point of intersection of a circular orbit of electrons and the laser light 11 becomes a scattering region 5, where light having a shorter wavelength than the laser light 11 such as an X-ray 13 is emitted. If a pair of X-ray mirrors 14 is arranged in the direction of emission of the X-ray 13, storage of high energy photons also becomes possible and it becomes possible to raise a brightness of high energy photons.

Assuming a radius of the electron storage ring as r, a velocity of electrons as v, a velocity of light as c, if the equation:

$$\frac{2\pi r}{L} = \frac{v}{c}$$

is satisfied, the once collided electrons and photons repeatedly collide until the beams attenuate due to various losses.

For example, assuming v/c≈1, L=1 (m), r=1/Π and a reflectance of the mirrors 12 comprising the resonator R is 99.99% and in the case that a transmission loss etc. can be neglected, the number of photons stored in the resonator $N_p'$ becomes:

$$Np' = \frac{1}{1-R} \simeq 10^4$$

Therefore, electrons travel back and forth about 104 times inside the resonator and the time the electrons stay in the resonator is:

$$\frac{L \cdot Np'}{c} = \frac{10^2 \text{ (cm)} \times 10^4}{2 \times 10^{10} \text{ (cm/s)}} \simeq 33 \text{ (}\mu\text{s)}$$

As mentioned above, according to the light source of the semiconductor manufacturing apparatus of the present embodiment, since $10^4$ times the photons compared with the photons emitted from the laser is supplied to the resonator and are made to collide with the electrons in the electron storage ring, it is possible to greatly increase the yield γ of the laser Compton scattered light.

EXAMPLE 1

Below, the following Examples 1 and 2 and Comparative Examples 1 and 2 show the results of ablation on a wafer with laser Compton scattered light using the above-mentioned inverse Compton scattering.

Figure 4A:
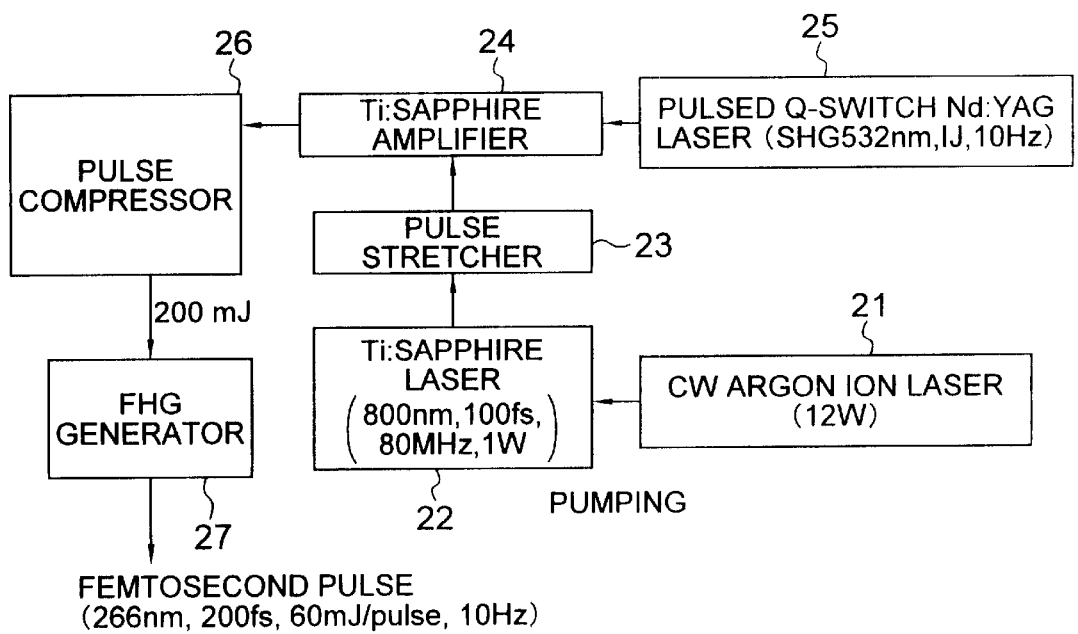

In Example 1 and Example 2, femtosecond pulses of 266 nm wavelength taken from a laser system shown in FIG. 4(A) were made to collide with the electron beam shown in FIG. 3 to generate laser Compton scattered light which is emitted on a wafer.

Figure 4B:
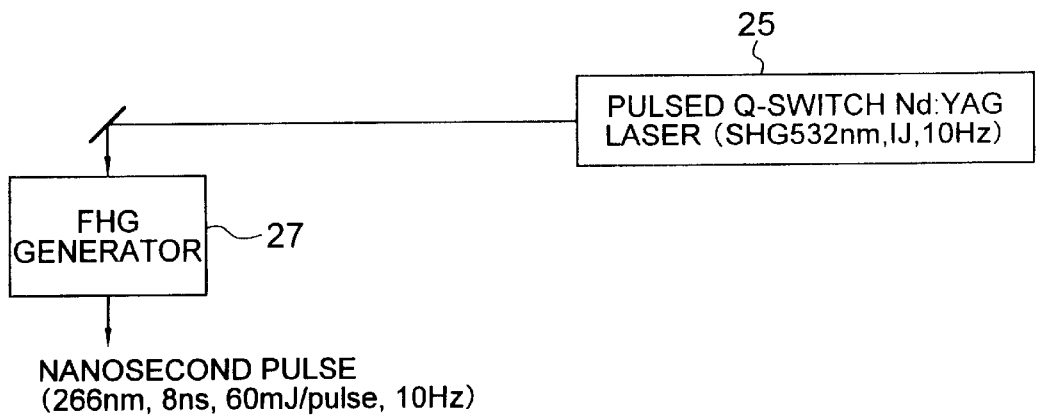
FIG. 4B is a view of the configuration of a light source part according to Comparative Example 1 and Comparative Example 2.

In Comparative Example 1 and Comparative Example 2, nanosecond pulses of 266 nm wavelength taken from a laser system shown in FIG. 4(B) were made to collide with the electron beam shown in FIG. 3 to generate laser Compton scattered light which is emitted on a wafer.

First, the method of generating femtosecond pulses in Example 1 and Example 2 will be explained below.

As shown in FIG. 4(A), a pulsed oscillation mode-locked titanium-sapphire laser 22 was pumped with a CW oscillation argon ion laser 21. The laser light emitted from the titanium-sapphire laser 22 was 800 nm in wavelength and had a pulse width of 100 fs, a pulse frequency of 80 MHZ, and an output of 1W.

The laser light from the titanium-sapphire laser 22 was guided to a pulse stretcher 23. The pulse width was stretched 2 to 4 orders at the pulse stretcher 23, then the light was guided to a titanium-sapphire amplifier 24. As the titanium-sapphire amplifier 24, a three-stage amplifier comprised of a reproducing amplifier and multipass amplifiers was used.

Pulsed light of the infrared region (800 nm in wavelength) from the pulse stretcher 23 was amplified by the titanium-sappire amplifier 24 and used for pumping a second harmonic of an Nd:YAG laser 25 (532 nm in wavelength, 1J in output, and 10 Hz in pulse frequency).

The second harmonic from the Nd:YAG laser 25 pumped with the laser light from the titanium-sapphire laser 22 was guided to a pulse compressor 26 comprised of a diffraction grating etc. and again compressed to a pulse of femtoseconds. This femtosecond pulsed light (200 mJ) was guided to the fourth harmonic generator 27 to obtain a femtosecond pulse (266 nm in wavelength, pulse width of 200 fs, pulse energy of 60 mJ, beam diameter of 2 mm, and pulse frequency of 10 Hz).

Next, the method of making samples for evaluation of ablation used in Example 1 and Comparative Example 1 will be explained.

Teflon AF1600S (Du Pont, trademark) was coated on a silicon substrate by spin-coating to a thickness of about 1 μm to form a film.

In Example 1, 400 pulses of the above-mentioned femtosecond pulsed laser Compton scattering light were emitted to the surface of the wafer made by the above-mentioned method through a mask having a line-and-space pattern of 0.3 μm. As a result, in the part exposed by the laser Compton scattered light, the Teflon layer was completely removed and the transfer of the pattern by ablation was recognized.

Comparative Example 1

A method of generating nanosecond pulses in Comparative Example 1 and Comparative Example 2 will be explained below.

As shown in FIG. 4(B), a second harmonic from an Nd:YAG laser 25 (532 nm in wavelength, pulse width of 8 ns, output energy of 1 J, pulse frequency of 10 Hz) was guided to a fourth harmonic generator 27 to obtain a nanosecond pulse (266 nm in wavelength, pulse width of 8 ns, pulse energy of 180 mJ, and pulse frequency of 10 Hz).

For the purpose of making the pulse energy of the nanosecond pulse mentioned above equivalent to the pulse energy of the femtosecond pulse in Example 1, an ND (neutral density) filter was used to make the pulse energy 60 mJ.

In Comparative Example 1, 400 pulses of the above mentioned nanosecond pulsed laser Compton scattered light were emitted to the surface of the wafer made by the same method as the above-mentioned Example 1 through a mask having a line-and-space pattern of 0.3 μm. As a result, the surface of the part exposed by the laser Compton scattered light was only roughed and the Teflon layer could not be removed.

As shown in Example 1 and Comparative Example 1, the ablation of the surface of the wafer (Teflon layer) was achieved by making the laser inducing the laser Compton scattered light ultra-short pulses with a pulse width of 1 ns or less.

EXAMPLE 2

In Example 2 and Comparative Example 2, wafers comprised of silicon substrates having oxide layers ($SiO_2$ layer) stacked on them were used as samples for evaluation of ablation.

The surface of the wafers mentioned above were irradiated by 1000 pulses of the femtosecond pulsed laser Compton scattered light the same as the above mentioned Example 1 through a mask having a line-and-space pattern of 0.3 μm. As a result, in the parts exposed by the laser Compton scattered light, the oxide layers were removed and clear transfer of the patterns by ablation was recognized.

Comparative Example 2

In Comparative Example 2, the surface of a wafer the same as Example 2 mentioned above was irradiated by 1000 pulses of the nanosecond pulsed laser Compton scattered light the same as Comparative Example 1 mentioned above through a mask having a line-and-space pattern of 0.3 μm. As a result, there was an appreciable change in the part exposed by the laser Compton scattered light, but the oxide layer was not removed and the pattern was not transferred clearly.

As shown in Example 2 and Comparative Example 2, the ablation of the surface of the wafer (oxide layer) was achieved by changing the laser inducing the laser Compton scattered light into ultra-short pulses with a pulse width of 1 ns or less.

According to the semiconductor manufacturing apparatus of the above embodiment of the present invention, it is made possible to emit light having a high brightness, high energy, and short pulse width on the surface of a wafer and to form a precise pattern by ablation.

According to the semiconductor device manufacturing method of the above embodiment of the present invention, it is possible to simplify the production process compared with the conventional patterning by etching, since the development of the resist and etching using a resist as a mask can be omitted.

The embodiments of the semiconductor manufacturing apparatus and the semiconductor device manufacturing method of the present invention are not limited to the above explanation. For example, the laser system for generating laser Compton scattered light may be suitably modified.

In addition, various modifications may be made within a range not outside the gist of the present invention.

According to the semiconductor manufacturing apparatus of the present invention, it is made possible to form a fine pattern precisely on the surface of a wafer.

According to the semiconductor device manufacturing method of the present invention, it is made possible to form a pattern on the surface of a wafer with a simplified process compared with the case of etching using a resist as a mask.

Also, according to the semiconductor device manufacturing method of the present invention, it is made possible to form a finer pattern clearly compared with the conventional ablation method.

What is claimed is:

1. A semiconductor manufacturing apparatus comprising a light source emitting light of a first wavelength to a surface of a wafer and a mask through which at least a part of the light of the first wavelength passes and removing a material of a part of the wafer exposed by the light of the first wavelength by vaporization, wherein the light source comprises an electron beam generating means for generating an electron beam and a light emitting means for emitting light of a second wavelength which is longer than the first wavelength, and the light of the first wavelength is inverse Compton scattered light obtained by collision of electrons in the electron beam with photons in the light of the second wavelength causing the energy of the electrons to be given to the photons.

2. A semiconductor manufacturing apparatus as set forth in claim 1, wherein the light emitting means comprises a laser.

3. A semiconductor manufacturing apparatus as set forth in claim 2, wherein the laser comprises a pulsed laser.

4. A semiconductor manufacturing apparatus as set forth in claim 1, wherein the light source has at least a pair of reflecting means for reflecting the light of the second wavelength back and forth.

5. A semiconductor manufacturing apparatus comprising a light source emitting pulsed light to a surface of a wafer and a mask through which at least part of the pulsed light passes and removing a material of the part of the wafer exposed by the pulsed light by vaporization, wherein the pulsed light emitted from the light source has a wavelength of not more than about 300 nm and a pulse width of not more than about 1 ns.

6. A semiconductor manufacturing apparatus as set forth in claim 5, wherein the light source emits a synchrotron radiation light.

7. A semiconductor manufacturing apparatus as set forth in claim 5, wherein the light source emits a laser plasma light.

* * * * *